United States Patent
Maeda et al.

(10) Patent No.: US 8,044,441 B2
(45) Date of Patent: Oct. 25, 2011

(54) ELECTRODE PATTERNING LAYER COMPRISING POLYAMIC ACID OR POLYIMIDE, AND ELECTRONIC DEVICE EMPLOYING IT

(75) Inventors: Shinichi Maeda, Funabashi (JP); Go Ono, Funabashi (JP)

(73) Assignee: Nissan Chemical Industries, Ltd., Tokyo (JP)

( * ) Notice: Subject to any disclaimer, the term of this patent is extended or adjusted under 35 U.S.C. 154(b) by 457 days.

(21) Appl. No.: 11/993,243

(22) PCT Filed: Jun. 19, 2006

(86) PCT No.: PCT/JP2006/312260
§ 371 (c)(1),
(2), (4) Date: Dec. 20, 2007

(87) PCT Pub. No.: WO2006/137366
PCT Pub. Date: Dec. 28, 2006

(65) Prior Publication Data
US 2010/0159201 A1    Jun. 24, 2010

(30) Foreign Application Priority Data

Jun. 20, 2005    (JP) .................................. 2005-179210
Sep. 7, 2005    (JP) .................................. 2005-258620

(51) Int. Cl.
| H01L 21/335 | (2006.01) |
| H01L 29/43 | (2006.01) |
| H01L 21/44 | (2006.01) |
| G03F 7/004 | (2006.01) |
| G03F 6/038 | (2006.01) |
| G03C 1/73 | (2006.01) |
| B05D 5/12 | (2006.01) |

(52) U.S. Cl. ............ 257/245; 427/58; 427/77; 427/510; 438/584; 438/674; 430/270.1; 430/311; 430/319; 522/164

(58) Field of Classification Search ............... 430/270.1, 430/311, 319; 522/164, 134–147; 528/335; 427/58, 77, 510; 438/584, 674; 257/245
See application file for complete search history.

(56) References Cited

U.S. PATENT DOCUMENTS
4,877,718 A * 10/1989 Moore et al. .................. 430/326
(Continued)

FOREIGN PATENT DOCUMENTS
JP    2000 223270    8/2000
(Continued)

OTHER PUBLICATIONS
U.S. Appl. No. 12/302,031, filed Nov. 24, 2008, Maeda, et al.

Primary Examiner — Susan W Berman
(74) Attorney, Agent, or Firm — Oblon, Spivak, McClelland, Maier & Neustadt, L.L.P.

(57) ABSTRACT

Provided is an electrode patterning layer used for forming an electrode pattern of any optional shape depending on the difference in wettability with an electrode-forming solution, the electrode patterning layer employing a polyimide type resin which is highly reliable as an electronic material. The electrode patterning layer is prepared by irradiating a layer comprising a polyamic acid having repeating units at the formula (1) or a polyimide obtainable by cyclodehydration of such a polyamic acid, with ultraviolet ray in a pattern shape:

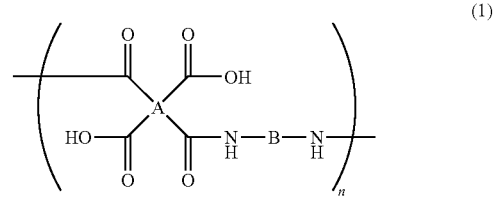

(1)

wherein A is a tetravalent organic group, B is a bivalent organic group, each of A and B may be of a single type or plural types, and n is a positive integer, provided that at least one type of A is a tetravalent organic group having an alicyclic structure.

21 Claims, 2 Drawing Sheets

U.S. PATENT DOCUMENTS

| | | | |
|---|---|---|---|
| 5,024,922 A * | 6/1991 | Moss et al. | 430/330 |
| 5,238,784 A * | 8/1993 | Tokoh et al. | 430/283.1 |
| 5,792,807 A * | 8/1998 | Hayashihara et al. | 524/425 |
| 6,010,825 A * | 1/2000 | Hagen et al. | 430/283.1 |
| 6,048,663 A * | 4/2000 | Fujii et al. | 430/270.1 |
| 6,159,654 A * | 12/2000 | Machida et al. | 430/270.1 |
| 6,489,431 B1 * | 12/2002 | Ishii et al. | 528/170 |
| 6,875,554 B2 * | 4/2005 | Hatanaka et al. | 430/270.1 |
| 6,927,274 B2 * | 8/2005 | Nomura et al. | 528/170 |
| 7,612,455 B2 * | 11/2009 | Tano et al. | 257/779 |
| 7,800,720 B2 * | 9/2010 | Tsuchiya et al. | 349/117 |
| 2004/0238816 A1 | 12/2004 | Tano et al. | |

FOREIGN PATENT DOCUMENTS

| | | |
|---|---|---|
| JP | 2004 146478 | 5/2004 |
| JP | 2004 273851 | 9/2004 |
| JP | 2004 349638 | 12/2004 |
| JP | 2005 86188 | 3/2005 |
| JP | 2005 93799 | 4/2005 |

* cited by examiner

ELECTRODE PATTERNING LAYER COMPRISING POLYAMIC ACID OR POLYIMIDE, AND ELECTRONIC DEVICE EMPLOYING IT

TECHNICAL FIELD

The present invention relates to a patterning layer to be used for preparing an electrode for an electronic device by coating with a solution, and it further relates to an electrode prepared by such a patterning layer and an electronic device having such an electrode.

BACKGROUND ART

At present, in the process for producing electronic devices, a masking vapor deposition method or an etching method by photolithography is mainly employed for the formation of a pattern of an electrode or a functional thin film. With respect to such conventional methods, problems have been pointed out such that enlarging the substrate is difficult, and the process is cumbersome.

In recent years, it has been proposed to apply a technique for selective coating utilizing the difference in wettability with a liquid to the patterning of a functional thin film. This is a method wherein a patterning layer comprising a region wettable with a liquid and a region hardly wettable with a liquid, is formed on a substrate surface, and then, on this patterning layer, a solution of a functional thin film-forming material is applied and dried, so that the functional thin film is formed only at the region wettable with a liquid. The method is intended to thereby prepare an electronic device such as an organic EL (electroluminescence) device or an organic FET (field-effect transistor) device.

As such a patterning layer for a functional thin film, a photocatalyst-containing layer comprising titanium dioxide and an organopolysiloxane, irradiated with ultraviolet light through a mask (e.g. Patent Document 1), or a layer comprising a fluoropolymer and a compound having a photoabsorption site such as a dye, irradiated with laser or irradiated with ultraviolet light through a mask (e.g. Patent Document 2) has, for example, been known. Further, a method for vapor deposition of a fluorinated coating agent through a mask has also been proposed (e.g. Patent Document 3).

Whereas, such a patterning layer will remain in the device even after completion of its role for patterning the functional thin film. Accordingly, such a patterning layer is required to have durability against the subsequent process steps and reliability not to adversely affect the properties of the electronic device even if it is present therein. Such properties required for the patterning layer may vary depending upon the particular device to be prepared or the particular place where the patterning layer is to be used. Among them, as a patterning layer for an electrode, the electrical insulating property becomes important.

In the techniques heretofore proposed, importance has been placed only on the properties as the patterning layer. Therefore, in patterning a source electrode and a drain electrode for an organic FET device, it is necessary to prepare a gate insulating film beneath the patterning layer.

On the other hand, a polyimide is excellent in heat resistance, mechanical strength, electrical insulating properties, chemical resistance, etc., and thus is used for various electronic devices. However, no case has been reported wherein a polyimide itself is used for a patterning layer as described above.

Patent Document 1: JP-A-2000-223270
Patent Document 2: JP-A-2004-146478
Patent Document 3: JP-A-2004-273851

DISCLOSURE OF THE INVENTION

Object to be Accomplished by the Invention

The present invention has been made under such circumstances, and it is an object of the present invention to provide an electrode patterning layer employing a polyimide type resin highly reliable as an electronic material.

Means to Accomplish the Object

In order to accomplish the above object, the present inventors have conducted an extensive study by paying attention to polyamic acids or polyimides and as a result, have found that by subjecting it to exposure to ultraviolet ray, a polyamic acid having a specific structure or a polyimide obtainable by cyclodehydration of such a polyamic acid, will function as an electrode patterning layer even when no special additive is employed. Namely, the present invention provides the following.

1. An electrode patterning layer to be used for forming an electrode pattern of any desired shape depending on the difference in wettability with an electrode-forming solution, said electrode patterning layer being prepared by irradiating a layer comprising a polyamic acid having repeating units represented by the following formula (1) or a polyimide obtainable by cyclodehydration of such a polyamic acid, with ultraviolet ray in a pattern shape:

wherein A is a tetravalent organic group, B is a bivalent organic group, each of A and B may be of a single type or plural types, and n is a positive integer, provided that at least one type of A is a tetravalent organic group having an alicyclic structure.

2. The electrode patterning layer according to the above 1, wherein the tetravalent organic group having an alicyclic group for A in the formula (1) is at least one member selected from the structures represented by the following formulae (2) to (5):

-continued in the formula (2), each of $R^1$, $R^2$, $R^3$ and $R^4$ which are independent of one another, is hydrogen, fluorine or a $C_{1-4}$ organic group.

3. The electrode patterning layer according to the above 1 or 2, wherein from 10 to 100 mol % of B in the formula (1) is at least one member selected from the structures represented by the following formulae (6) and (7):

wherein each X independently is a single bond, an ether bond, an ester bond, a thioether bond, an amide bond, a $C_{1-5}$ alkylene group which may have a branched structure, or a $C_{1-5}$ alkylenedioxo group which may have a branched structure, $R^5$ is an alkyl group having at most 4 carbon atoms, or a perfluoroalkyl group, $R^6$ is a monovalent organic group having a long chain alkyl group or a fluorinated long chain alkyl group, having at least 6 carbon atoms, and j is 0 or 1.

4. The electrode patterning layer according to any one of the above 1 to 3, wherein at least 20 mol % of A in the formula (1) is a tetravalent organic group having an alicyclic group.

5. The electrode patterning layer according to any one of the above 1 to 4, wherein at least 20 mol % of B in the formula (1) is a bivalent organic group having a fluorine atom, or a bivalent organic group having an alkyl group or a fluorinated alkyl group in its side chain.

6. The electrode patterning layer according to any one of the above 1 to 5, wherein the contact angle to water or the electrode-forming solution is at least 50° at a portion not irradiated with ultraviolet ray and at most 30° at a portion irradiated with ultraviolet ray.

7. A method for producing an electrode patterning layer, which comprises irradiating a layer comprising a polyamic acid having repeating units represented by the formula (1) as defined in the above 1 or a polyimide obtainable by cyclodehydration of such a polyamic acid, with ultraviolet ray in a pattern shape.

8. The electrode patterning layer according to the above 6, prepared by irradiation with ultraviolet ray at a dose of at most 40 J/cm².

9. A patterned electrode prepared by coating the electrode patterning layer as defined in the above 1 with an electrode-forming solution.

10. An electronic device having the patterned electrode as defined in the above 9.

11. An organic FET having the patterned electrode as defined in the above 9.

Effects of the Invention

By a method for forming a patterned electrode by using the electrode patterning layer of the present invention, it is possible to carry out patterning more finely than a mask-vapor deposition method, and it is possible to simplify the production process more than a photolithography method.

Further, the electrode patterning layer of the present invention also has an excellent electrical insulating property, whereby a reliability is high, it can be used also as a gate insulating layer for an organic FET, and the production step can be simplified to a large extent.

MEANINGS OF SYMBOLS

1: Gate electrode
2: Gate insulating film
3: Electrode patterning layer

4: Source/drain electrodes
5: Organic semiconductor layer

BEST MODE FOR CARRYING OUT THE INVENTION

Now, the present invention will be described in further detail.

The electrode patterning layer of the present invention is one to form an electrode of an optional shape depending on the difference in wettability with an electrode-forming solution by utilizing the difference in surface energy between a portion irradiated with ultraviolet ray and a non-irradiated portion. Accordingly, of such a patterning layer, the surface energy is required to change by irradiation with ultraviolet ray to such an extent that there will be a significant difference in wettability with an electrode-forming solution.

In the electrode patterning layer of the present invention, the one which causes the change in the surface energy by irradiation with ultraviolet ray, is a polyamic acid having repeating units represented by the following formula (1) or a polyimide obtainable by cyclodehydration of such a polyamic acid:

(1)

wherein A is a tetravalent organic group, B is a bivalent organic group, each of A and B may be of a single type or plural types, and n is a positive integer, provided that at least one type of A is a tetravalent organic group having an alicyclic structure.

It is considered that the change in the surface energy by irradiation with ultraviolet ray is attributable mainly to cleavage of the alicyclic structure contained in the above A. Accordingly, the (1), larger the proportion of the tetravalent organic group having an alicyclic structure in A in the above formula (1), the better, since the change in the surface energy thereby becomes large. In A in the formula (1), the proportion of the tetravalent organic group having an alicyclic structure is not particularly limited, but it is preferably at least 20 mol %, more preferably at least 50 mol %, particularly preferably at least 80 mol %.

Further, the structure of the tetravalent organic group having an alicyclic structure is not particularly limited, but the following formulae (2) to (5) may be mentioned as preferred specific examples.

(2)

(3)

(4)

(5)

In the formula (2), each of $R^1$, $R^2$, $R^3$ and $R^4$ which are independent of one another, is hydrogen, fluorine or a $C_{1-4}$ organic group.

In the above formula (1), the structure of B is not particularly limited, but it is preferred that at least one type of a bivalent organic group having a fluorine atom or a bivalent organic group having an alkyl group or a fluorinated alkyl group in its side chain, is contained. Such a bivalent organic group is capable of lowering the surface energy at the portion not irradiated with ultraviolet ray and increasing the contact angle to the electrode-forming solution, whereby it is possible to form an electrode in a finner pattern. In B of the formula (1), the proportion of the proportion of such a bivalent organic group intended to lower the surface energy is not particularly limited, but it is preferably from 10 to 100 mol %, more preferably at least 20 mol %, further preferably at least 50 mol %, particularly preferably at least 70 mol %, of B.

Preferred examples of the bivalent organic group having a fluorine atom or the bivalent organic group having an alkyl group or a fluorinated alkyl group in its side chain, are shown below, but the present invention is not limited thereto.

(6)

(7)

wherein each X independently is a single bond, an ether bond, an ester bond, a thioether bond, an amide bond, a $C_{1-5}$ alkylene group which may have a branched structure, or a $C_{1-5}$ alkylenedioxo group which may have a branched structure, $R^5$ is an alkyl group having at most 4 carbon atoms, or a perfluoroalkyl group, $R^6$ is a monovalent organic group having a long chain alkyl group or a fluorinated long chain alkyl group, having at least 6 carbon atoms, and j is 0 or 1.

The polyamic acid having repeating units represented by the above formula (1) can be obtained by a reaction of a tetracarboxylic dianhydride component containing at least tetracarboxylic dianhydride having an alicyclic structure, with a diamine component. Here, each of the tetracarboxylic dianhydride component and the diamine component may be of a single type or a combination of plural types.

The tetracarboxylic dianhydride having an alicyclic structure may, for example, be 1,2,3,4-cyclobutane tetracarboxylic dianhydride, 1,2-dimethyl-1,2,3,4-cyclobutane tetracarboxylic dianhydride, 1,3-dimethyl-1,2,3,4-cyclobutane tetracarboxylic dianhydride, 1,2,3,4-tetramethyl-1,2,3,4-cyclobutane tetracarboxylic dianhydride, 1,2,3,4-tetrafluoro-1,2,3,4-cyclobutane tetracarboxylic dianhydride, 1,2,3,4-cyclopentane tetracarboxylic dianhydride, 2,3,4,5-tetrahydrofuran tetracarboxylic dianhydride, 1,2,4,5-cyclohexane tetracarboxylic dianhydride, 3,4-dicarboxy-1-cyclohexyl succinic acid dianhydride, 3,4-dicarboxy-1,2,3,4-tetrahydro-1-naphthalene succinic acid dianhydride, bicyclo[3,3,0]octane-2,4,6,8-tetracarboxylic dianhydride, 3,3',4,4'-dicyclohexyl tetracarboxylic dianhydride, 2,3,5-tricarboxy cyclopentyl acetic dianhydride, cis-3,7-dibutylcycloocta-1,5-diene-1,2,5,6-tetracarboxylic dianhydride, tricyclo[4.2.1.0$^{2,5}$]nonane-3,4,7,8-tetracarboxylic acid-3,4:7,8-dianhydride or hexacyclo[6.6.0.1$^{2,7}$.0$^{3,6}$.1$^{9,14}$.0$^{10,13}$]hexadecane-4,5,11,12-tetracarboxylic acid-4, 5:11,12-dianhydride.

Among them, one whereby the structure of the above-mentioned formula (2) is obtainable, is 1,2,3,4-cyclobutane tetracarboxylic dianhydride, 1,2-dimethyl-1,2,3,4-cyclobutane tetracarboxylic dianhydride, 1,3-dimethyl-1,2,3,4-cyclobutane tetracarboxylic dianhydride, 1,2,3,4-tetramethyl-1,2,3,4-cyclobutane tetracarboxylic dianhydride or 1,2,3,4-tetrafluoro-1,2,3,4-cyclobutane tetracarboxylic dianhydride. One whereby the structure of the above-mentioned formula (3) is obtainable, is bicyclo[3,3,0]octane-2,4,6,8-tetracarboxylic dianhydride. One whereby the structure of the above-mentioned formula (4) is obtainable, is 3,4-dicarboxy-1,2,3,4-tetrahydro-1-naphthalene succinic acid dianhydride, and one whereby the structure of the formula (5) is obtainable, is 2,3,5-tricarboxy cyclopentyl acetic dianhydride.

Other tetracarboxylic dianhydrides which may be used to in combination include, for example, pyromellitic dianhydride, 3,3',4,4'-biphenyl tetracarboxylic dianhydride, 2,2',3,3'-biphenyl tetracarboxylic dianhydride, 2,3,3',4'-biphenyl tetracarboxylic dianhydride, 3,3',4,4'-benzophenone tetracarboxylic dianhydride, 2,3,3',4'-benzophenone tetracarboxylic dianhydride, bis(3,4-dicarboxyphenyl)ether dianhydride, bis(3,4-dicarboxyphenyl)sulfonic dianhydride, 2,2-bis(3,4-dicarboxyphenyl)-1,1,1,3,3,3-hexafluoropropane dianhydride, 1,2,5,6-naphthalene tetracarboxylic dianhydride, 2,3,6,7-naphthalene tetracarboxylic dianhydride and 1,2,3,4-butane tetracarboxylic dianhydride.

In order to adjust the tetravalent organic group having an alicyclic structure to an optional proportion in A in the formula (1), the proportion of the tetracarboxylic dianhydride having an alicyclic structure in the tetracarboxylic dianhydride component to be used for the reaction to prepare a polyamic acid, may be adjusted to the desired proportion.

As specific examples of the diamine component, the following diamines may be mentioned.

Examples of an alicyclic diamine include 1,4-diaminocyclohexane, 1,3-diaminocyclohexane, 4,4'-diaminodicyclohexylmethane, 4,4'-diamino-3,3'-dimethyl-dicyclohexylamine and isophorone diamine.

Examples of a carbon ring aromatic diamine include o-phenylenediamine, m-phenylenediamine, p-phenylenediamine, a diaminotoluene (such as 2,4-diaminotoluene), 1,4-diamino-2-methoxybenzene, 2,5-diaminoxylene, 1,3-diamino-4-chlorobenzene, 1,4-diamino-2,5-dichlorobenzene, 1,4-diamino-3-isopropylbenzene, 4,4'-diaminodiphenylmethane, 2,2'-diaminostilbene, 4,4'-diaminostilbene, 4,4'-diaminodiphenyl ether, 4,4'-diphenyl thioether, 4,4'-diaminodiphenyl sulfone, 3,3'-diaminodiphenyl sulfone, 4,4'-diaminobenzoic acid phenyl ester, 2,2'-diaminobenzophenone, 4,4'-diaminobenzyl, 4-(4'-aminophenyl)aniline, bis(4-aminophenyl)phosphine oxide, bis(3-aminophenyl)methylsulfine oxide, bis(4-aminophenyl)phenylphosphine oxide, bis(4-aminophenyl)cyclohexylphosphine oxide, N,N-bis(4-aminophenyl)-N-phenylamine, N,N-bis(4-aminophenyl)-N-methylamine, 4,4'-diaminodiphenylurea, 1,8-diaminonaphthalene, 1,5-diaminonaphthalene, 1,5-diaminoanthraquinone, diaminofluorene (such as 2,6-diaminofluorene), bis(4-aminophenyl)diethylsilane, bis(4-aminophenyl)dimethylsilane, bis(4-aminophenyl)tetramethyldisiloxane, 3,4'-diaminodiphenyl ether, benzidine, 2,2'-dimethylbenzidine, bis[4-(4-aminophenoxy)phenyl]sulfone, 4,4'-bis(4-aminophenoxy)biphenyl, 1,4-bis(4-aminophenoxy)benzene and 1,3-bis(4-aminophenoxy)benzene.

A heterocyclic diamine may, for example, be 2,6-diaminopyridine, 2,4-diaminopyridine, 2,4-diamino-s-triazine, 2,7-diaminodibenzofuran, 2,7-diaminocarbazole, 3,7-diaminophenothiazine, 2,5-diamino-1,3,4-thiadiazole or 2,4-diamino-6-phenyl-s-triazine. Examples of an aliphatic diamine include diaminomethane, 1,2-diaminoethane, 1,3-diaminopropane, 1,4-diaminobutane, 1,6-diaminohexane, 1,7-diaminoheptane, 1,8-diaminooctane, 1,9-diaminononane, 1,10-diaminodecane, 1,3-diamino-2,2-dimethylpropane, 1,4-diamino-2,2-dimethylbutane, 1,6-diamino-2,5-dimethylhexane, 1,7-diamino-2,5-dimethylheptane, 1,7-diamino-4,4-dimethylheptane, 1,7-diamino-3-methylheptane, 1,9-diamino-5-methylnonane, 2,11-diaminododecane, 1,12-diaminooctadecane and 1,2-bis(3-aminopropoxy)ethane.

Further, by using a diamine represented by the following formula (8) or (9), it is possible to incorporate the structure of the above formula (6) or (7) as B in the formula (1).

(8)

(9)

wherein each X independently is a single bond, an ether bond, an ester bond, a thioether bond, an amide bond, a $C_{1-5}$ alkylene group which may have a branched structure or a $C_{1-5}$ alkylenedioxo group which may have a branched structure, $R^5$ is an alkyl group having at most 4 carbon atoms, or a perfluoroalkyl group, $R^6$ is a monovalent organic group having a long chain alkyl group or a fluorinated long chain alkyl group, having at least 6 carbon atoms, and j is 0 or 1.

Specific examples of such a diamine include 2,2-bis(4-aminophenyl)propane, 2,2-bis(4-aminophenyl)hexafluoropropane, 2,2-bis[4-(4-aminophenoxy)phenyl]propane, 2,2-bis[4-(4-aminophenoxy)phenyl]hexafluoropropane, 4-hexadecyloxy-1,3-diaminobenzene, 4-octadecyloxy-1,3-diaminobenzene and 4-[4-(4-heptylcyclohexyl)phenoxy]-1, 3-diaminobenzene.

In order to bring the bivalent organic group having the specific structure to an optional proportion in B in the formula (1), the proportion of the diamine corresponding to the specific structure in the diamine component to be used for the reaction for preparation of the polyamic acid, may be adjusted to the desired proportion.

The polymerization reaction to obtain a polyamic acid may be carried out by mixing the tetracarboxylic dianhydride component and the diamine component in an organic solvent.

The method for mixing the tetracarboxylic dianhydride component and the diamine component in an organic solvent, may, for example, be a method wherein a solution having the diamine component dispersed or dissolved in an organic solvent, is stirred, and the tetracarboxylic dianhydride component is added as it is or as dispersed or dissolved in an organic solvent, a method wherein inversely, the diamine component is added to a solution having the tetracarboxylic dianhydride component dispersed or dissolved in an organic solvent, or a method wherein the tetracarboxylic dianhydride component and the diamine component are alternately added. Further, in a case where the tetracarboxylic dianhydride component or the diamine component is composed of a plural types of compounds, such plural types of the component may be subjected to polymerization reaction in a preliminarily mixed state or may be separately and sequentially subjected to the polymerization reaction.

The temperature for the polymerization reaction of the tetracarboxylic dianhydride component with the diamine component in an organic solvent is usually from −20 to 150° C., preferably from 0 to 80° C. As the temperature becomes high, the polymerization reaction will be completed quickly, but if the temperature is too high, a polyamic acid having a high molecular weight may not sometimes be obtainable.

Further, the polymerization reaction can be carried out at an optional concentration, but if the concentration is too low, a polymer having a high molecular weight tends to be hardly obtainable, and if the concentration is too high, the viscosity of the reaction solution tends to be too high, and uniform stirring tends to be difficult. Accordingly, it is preferably from 1 to 50 wt %, more preferably from 5 to 30 wt %. At the initial stage, the polymerization reaction may be carried out at a high concentration, and then, an organic solvent may be added.

The organic solvent to be used for the above reaction is not particularly limited so long as it is capable of dissolving the formed polyamic acid. Specific examples thereof may be N,N-dimethylformamide, N,N-dimethylacetamide, N-methyl-2-pyrolidone, N-methylcaprolactam, dimethylsulfoxide, tetramethylurea, pyridine, dimethylsulfone, hexamethylsulfoxide and γ-butyrolactone. They may be used alone or in combination as a mixture. Further, even a solvent which does not dissolve a polyamic acid, may be used as mixed to the above solvent within such a range that the formed polyamic acid will not precipitate. Further, moisture in the reaction system tends to impair the polymerization reaction and is likely to cause hydrolysis of the formed polyamic acid. Therefore, it is preferred to employ an organic solvent which has been dried to remove water. It is further preferred that the interior of the reaction system is kept to be a nitrogen atmosphere, and it is further preferred to carry out the reaction while bubbling nitrogen in the solvent in the reaction system.

The ratio of the tetracarboxylic dianhydride component to the diamine component to be used for the polymerization reaction for a polyamic acid is preferably from 1:0.8 to 1:1.2 by molar ratio. As this molar ratio is close to 1:1, the molecular weight of the obtainable polyamic acid becomes large.

The molecular weight of the polyamic acid to be used in the present invention is preferably from 2,000 to 200,000, more preferably from 5,000 to 50,000 by weight average molecular weight from the viewpoint of the stability of the properties when formed into a film.

The polyamic acid obtained as described above may be purified by putting the reaction solution into a poor solvent being stirred and reprecipitating it. The poor solvent to be used at that time is not particularly limited, and it may, for example, be methanol, acetone, hexane, butyl cellosolve, heptane, methyl ethyl ketone, methyl isobutyl ketone, ethanol, toluene or benzene. The polyamic acid obtained by the reprecipitation may be filtered and recovered and then dried at room temperature or under heating under atmospheric pressure or reduced pressure to obtain a powder. When an operation of further dissolving this powder in a good solvent, followed by reprecipitation is repeated from 2 to 10 times, whereby impurities in the polymer become less, and the characteristics when it is formed into a thin film will be improved. Further, as the poor solvent in such a case, it is preferred to employ at least three poor solvents such as alcohols, ketones and hydrocarbons, whereby the purification efficiency will be more increased.

As a method for forming the layer comprising a polyamic acid having repeating units represented by the formula (1) or a polyimide obtainable by cyclodehydration of such a polyamic acid, it is convenient to adopt a method of applying and baking on a substrate a coating solution containing such a polyamic acid or a method of applying and baking on a substrate a coating solution containing a soluble polyimide obtainable by cyclic dehydration of such a polyamic acid.

As the cyclodehydration (imidation) reaction to obtain a soluble polyimide, thermal imidation of directly heating the solution of a polyamic acid obtainable as described above, as it is, or chemical imidation of adding a catalyst to the solution of a polyamic acid, is common, but the chemical imidation wherein the imidation reaction proceeds at a relatively low temperature, is preferred, since a decrease in the molecular weight of the obtainable soluble polyimide is less likely to occur. The chemical imidation may be carried out by stirring the polyamic acid in an organic solvent in the presence of a basic catalyst and an acid anhydride for from 1 to 100 hours.

The basic catalyst may, for example, be pyridine, triethylamine, trimethylamine, tributylamine or trioctylamine. Among them, pyridine is preferred, since it has a proper basicity to let the reaction proceed. Whereas, the acid anhydride may, for example, be acetic anhydride, trimellitic anhydride or pyromellitic anhydride. Among them, acetic anhydride is preferred, since purification of the obtained polyimide will be easy after completion of the imidation. As the organic solvent, it is possible to use a solvent which is used at the time of the above-described polymerization reaction for a polyamic acid.

The imidated ratio of the polyimide may be controlled by adjusting the amount of the catalyst, the reaction temperature and the reaction time. At that time, the amount of the basic catalyst is preferably from 0.2 to 10 times by mol, more preferably from 0.5 to 5 times by mol of amic acid groups. Further, the amount of the acid anhydride is preferably from 1 to 30 times by mol, more preferably from 1 to 10 times by mol of the amic acid groups. The reaction temperature is preferably from −20 to 250° C., more preferably from 0 to 180° C. The imidated ratio of the soluble polyimide to be used in the present invention, is not required to be 100%, and it may be one partially imidated to such an extent that a proper solubility in the organic solvent can be maintained.

The soluble polyimide obtained as described above, may be purified in the same manner as the above-described polyamic acid.

The coating solution containing the polyamic acid or the soluble polyimide may be obtained by dissolving or uniformly dispersing such a polymer in at least one solvent.

The concentration of the coating solution is preferably from 0.1 to 30 wt %, more preferably from 1 to 10 wt %, as the polymer component.

The solvent for the coating solution is not particularly limited, but one capable of dissolving the polyamic acid or the polyimide is preferred. Such a preferred one may, for example, be N,N-dimethylformamide, N,N-dimethylacetamide, 2-pyrolidone, N-methyl-2-pyrolidone, N-ethyl-2-pyrolidone, N-vinyl-2-pyrolidone, N-methylcaprolactam, dimethylsulfoxide, tetramethylurea, pyridine or γ-butyrolactone. These may be used alone or in combination as a mixture.

Further, other solvents may be mixed to secure the flatness of the coating film, to improve the wettability of the substrate with the coating solution or for the purpose of adjusting the surface tension, polarity and boiling point of the coating solution. Specific examples of such other solvents include ethylene glycol derivatives such as ethyl cellosolve, butyl cellosolve, ethyl carbitol, butyl carbitol and ethyl carbitol acetate; propylene glycol derivatives such as 1-methoxy-2-propanol, 1-ethoxy-2-propanol, 1-butoxy-2-propanol, 1-phenoxy-2-propanol, propylene glycol monoacetate, propylene glycol diacetate, propylene glycol-1-monomethylether-2-acetate, propylene glycol-1-monoethyl ether-2-acetate, dipropylene glycol, 2-(2-methoxypropoxy)propanol, 2-(2-ethoxypropoxy)propanol and 2-(2-butoxypropoxy)propanol; and lactic acid derivatives such as methyl lactate, ethyl lactate, n-propyl lactate, n-butyl lactate or isoamyl lactate. They may be used alone or in combination as a mixture.

With a view to improvement of the storage stability of the coating solution and the uniformity in thickness of the coating film, it is preferred that from 20 to 80 wt % of the total amount of solvents is constituted by at least one solvent selected from N,N-dimethylformamide, N,N-dimethylacetamide, N-methyl-2-pyrrolidone, γ-butyrolactone and dimethylsulfoxide.

Further, for the purpose of improving the adhesion between the substrate and the layer comprising the polyamic acid or the polyamide, an additive such as a coupling agent may be added to the coating solution. Specific examples of such an additive include 3-aminopropyltrimethoxysilane, 3-aminopropyltriethoxysilane, 2-aminopropyltrimethoxysilane, 2-aminopropyltriethoxysilane, N-(2-aminoethyl)-3-aminopropyltrimethoxysilane, N-(2-aminoethyl)-3-aminopropylmethyldimethoxysilane, 3-ureidepropyltrimethoxysilane, 3-ureidepropyltriethoxysilane, N-ethoxycarbonyl-3-aminopropyltrimethoxysilane, N-ethoxycarbonyl-3-aminopropyltriethoxysilane, N-trimethoxysilyl propyltriethylene triamine, N-triethoxysilyl propyltriethylene triamine, 10-trimethoxysilyl-1,4,7-triazadecane, 10-triethoxysilyl-1,4,7-triazadecane, 9-trimethoxysilyl-3,6-diazanonyl acetate, 9-triethoxysilyl-3,6-diazanonyl acetate, N-benzyl-3-aminopropyltrimethoxysilane, N-benzyl-3-aminopropyltriethoxysilane, N-phenyl-3-aminopropyltrimethoxysilane, N-phenyl-3-aminopropyltriethoxysilane, N-bis(oxyethylene)-3-aminopropyltrimethoxysilane, N-bis(oxyethylene)-3-aminopropyltriethoxysilane, ethylene glycol diglycidyl ether, polyethylene glycol diglycidyl ether, propylene glycol diglycidyl ether, tripropylene glycol diglycidyl ether, polypropylene glycol diglycidyl ether, neopentyl glycol diglycidyl ether, 1,6-hexanediol diglycidyl ether, glycerol diglycidyl ether, 2,2-dibromoneopentyl glycol diglycidyl ether, 1,3,5,6-tetraglycidyl-2,4-hexanediol, N,N,N',N'-tetraglycidyl-m-xylylenediamine, 1,3-bis(N,N-diglycidylaminomethyl)cyclohexane and N,N,N',N'-tetraglycidyl-4,4'-diaminodiphenylmethane. The content of such a functional silane-containing compound or an epoxy group-containing compound is preferably from 0.1 to 30 wt %, more preferably from 1 to 20 wt %, based on the total polymer weight in the coating solution.

Application of the above-described coating solution may be carried out by a dipping method, a spin coating method, a transfer printing method, a roll coating method, an ink jetting method, a spraying method or a brush-coating method, and uniform film forming is possible by the respective methods.

The baking method after the application of the coating solution on the substrate is not particularly limited, and it can be carried out by means of a hot plate or an oven in a suitable atmosphere i.e. in atmospheric air, an inert gas such as nitrogen or in vacuum. The baking temperature is not particularly limited so long as the solvent can be evaporated, but it is preferably carried out at a temperature of from 40 to 250° C. In order to increase the uniformity of the coating film or to let the imidation reaction proceed on the substrate, the temperature may be changed in two or more steps.

In a case where a polyamic acid is contained in the coating solution, it may undergo cyclodehydration to form a polyimide by this baking. Otherwise, in a case where a polyimide not completely imidated, is contained, the imidated ratio may be increased by this baking.

In the electrode patterning layer of the present invention, the polyamic acid may stay as it is, but the imidated ratio is preferably high from the viewpoint of the solvent resistance and with a view to reducing amic groups having high polarity.

With respect to the layer comprising the polyamic acid or the polyimide thus obtained, if it is too thin, the patterning property after irradiation with ultraviolet ray tends to deteriorate, and if it is too thick, the uniformity of the surface tends to be impaired. Accordingly, its thickness is preferably from 5 nm to 1,000 nm, more preferably from 10 nm to 300 nm, most preferably from 20 nm to 100 nm.

Further, the electrode patterning layer of the present invention may be permitted to function by itself as an insulating film when its insulating property is sufficiently high. In such a case, the electrode patterning layer may be used as a gate insulating film by disposing it directly on a gate electrode, for example, in an organic FET device. In such a case, the electrode patterning layer should better be thicker than the above-described case, for the purpose of securing the insulating property. Its thickness is preferably from 20 nm to 1,000 nm, more preferably from 50 nm to 800 nm, most preferably from 100 nm to 500 nm.

In the electrode patterning layer of the present invention, the method for irradiation with ultraviolet ray in a pattern shape is not particularly limited. For example, a method of irradiation through a mask having an electrode pattern drawn, or a method of drawing an electrode pattern by means of a laser beam, may, for example, be mentioned.

As the above mask, the material and shape are not particularly limited, so long as ultraviolet ray is permitted to pass through a region where an electrode is required, and ultraviolet ray is not permitted to pass through the rest of region.

The wavelength of ultraviolet ray to be used may usually be within a range of from 100 nm to 400 nm. Particularly preferably, it is advisable to select a proper wavelength through e.g. a filter depending upon the type of the polyimide to be used.

In the electrode patterning layer of the present invention, its surface energy will be gradually increased by irradiation with ultraviolet ray and will be saturated upon irradiation with a sufficient dose. The rise of this surface energy will bring about a decrease in the contact angle to the electrode-forming solution, whereby the wettability with the electrode-forming solution will be improved at the portion irradiated with ultraviolet ray. Accordingly, when the electrode-forming solution is applied on the electrode patterning layer of the present invention, the electrode-forming solution will form a pattern in a self organizing manner along the shape drawn as the difference in the surface energy on the electrode patterning layer, whereby an electrode having an optional pattern can be obtained.

For this purpose, the electrode patterning layer is required to be irradiated with ultraviolet ray at a dose whereby the contact angle of the electrode-forming solution will sufficiently change. However, from the viewpoint of the energy efficiency and shortening of the time for the production process, the dose of ultraviolet ray is preferably at most 40 J/cm$^2$, more preferably at most 30 J/cm$^2$, most preferably at most 20 J/cm$^2$.

Further, the larger the difference in the contact angle to the electrode-forming solution between the portion irradiated with ultraviolet ray and the non-irradiated portion of the electrode patterning layer, the easier the patterning, and it becomes possible to process the electrode in a complicated pattern or fine pattern shape. Accordingly, the change in the contact angle by irradiation with ultraviolet ray is preferably at least 10°, more preferably at least 30°, most preferably at least 50°. For the same reason, the contact angle to the electrode-forming solution is preferably at least 50° at the portion not irradiated with ultraviolet ray and at most 30° at the portion irradiated with ultraviolet ray. At present, water is used as the solvent for the electrode-forming solution in many cases, and the contact angle to the electrode-forming solution may simply be regarded as the contact angle to water.

In the present invention, the electrode-forming solution is a coating solution which can be used as an electrode by applying on a substrate and then evaporating the solvent contained therein. As such an example, one may be mentioned wherein a charge-transport substance is dissolved or uniformly dispersed in at least one solvent. Here, the charge-transport property has the same meaning as electrical conductivity and is meant for either an electron hole transport property, an electron transport property or an electron hole and electron both charge-transport property.

The above charge-transport substance is not particularly limited so long as it has an electrical conductivity capable of transporting electron holes or electrons. As an example, fine particles of metal such as gold, silver, copper or aluminum, an inorganic material such as carbon black, fullerenes or carbon nanotubes, or an organic π-conjugated polymer such as polythiophene, polyaniline, polypyrrole, polyfluorene or a derivative thereof, may, for example, be mentioned. Further, for the purpose of improving the charge-transporting ability of the charge-transport substance, a charge-accepting substance or a charge-donating substance may be added as a dopant.

The solvent for the electrode-forming solution is not particularly limited so long as it is capable of dissolving or uniformly dispersing the above-mentioned charge-transport substance or the dopant. However, with a view to obtaining a precise electrode pattern, the solvent is desired to show a sufficiently large contact angle to the portion not irradiated with ultraviolet ray of the electrode patterning layer and present minimum damage to the electrode patterning layer of the present invention, and water or various alcohols are preferred. Further, a polar solvent such as N,N-dimethylformamide, N,N-dimethylacetamide, 2-pyrolidone, N-methyl-2-pyrolidone, N-ethyl-2-pyrolidone, N-vinyl-2-pyrolidone, N-methylcaprolactam, dimethylsulfoxide or tetramethylurea is also preferred from such a viewpoint that the solubility of an organic charge-transport substance is excellent, and it shows a sufficient contact angle to the portion not irradiated with ultraviolet ray of the electrode patterning layer, but it is preferred that such a polar solvent is used within a range where the damage to the electrode patterning layer of the present invention is little.

The concentration of the charge-transport substance in the electrode-forming solution is preferably from 0.01 to 30 wt %, more preferably from 0.1 to 10 wt %, most preferably from 1 to 5 wt %.

As a specific example of a charge-transport varnish of the present invention, Baytron P (tradename, manufactured by Bayer Ltd.) may, for example, be mentioned.

An electrode according to the present invention is prepared by applying the above electrode-forming solution on the electrode patterning layer of the present invention to form a pattern and then evaporating the solvent. The method for evaporating the solvent is not particularly limited. However, by using a hot plate or an oven, the evaporation may be carried out in a suitable atmosphere i.e. in atmospheric air, an inert gas such as nitrogen or in vacuum, whereby it is possible to obtain a uniform film surface.

The temperature to evaporate the solvent is not particularly limited, but the evaporation is preferably carried out at a temperature of from 40 to 250° C. In order to form a more precise pattern or to obtain a more uniform film forming property, the temperature may be changed in at least two steps.

The electrode prepared from such an electrode-forming solution may be used not only as a wiring for connecting electronic devices to one another but also as an electrode for electronic devices such as field-effect transistors, bipolar transistors, various diodes, or various sensors.

The electronic device according to the present invention is one having the above electrode of the present invention.

Now, a method of using an electrode patterning layer will be described with reference to an organic FET device as an example, but the present invention is by no means restricted thereto.

As a substrate, a highly-doped n-type silicon substrate is prepared. It is preferred that the substrate is preliminarily cleaned by cleaning with a liquid such as a detergent, an alcohol or pure water, and immediately before use, surface treatment such as ozone treatment or oxygen-plasma treatment is carried out. On the substrate, $SiO_2$, $Ta_2O_5$, $Al_2O_3$ or the like is deposited by thermal oxidation, sputtering, CVD or vapor deposition to form a gate insulating film. The thickness of the gate insulating layer varies depending upon the particular application of the organic FET, but is preferably within a range of from 30 nm to 1,000 nm in view of the balance of the drive voltage and the electrical insulating property.

Then, on the insulating film, the above-mentioned layer comprising a polyamic acid having repeating units represented by the formula (1) or a polyimide obtainable by cyclodehydration of such a polyamic acid, is formed as described above. The thickness of the layer is most preferably from 20 nm to 100 nm. Then, the layer is irradiated with ultraviolet ray in a pattern shape to obtain an electrode patterning layer.

Then, an electrode-forming solution employing a polar solvent such as water, is applied on the surface of the electrode patterning layer. The applied electrode-forming solution will readily spread and be stabilized on a hydrophilic portion (the portion irradiated with ultraviolet ray) while repelling the hydrophobic portion (the portion not irradiated with ultraviolet ray), and then dried, whereby patterned source and drain electrodes will be formed. The method for applying the electrode-forming solution may, for example, be a spin coating method or a casting method and is not particularly limited, but an ink jet printing method or a spray coating method, whereby the amount of the solution can easily be controlled, is preferred.

Finally, an organic semiconductor material such as pentacene or polythiophene is formed into a film as an active layer of organic FET. The method for forming the organic semiconductor material into a film is not particularly limited. For example, vacuum vapor deposition, or a spin coating method, a casting method, an ink jet printing method or a spray coating method of a solution, may be mentioned.

With the organic FET prepared as described above, the production process can be substantially reduced, and further, it is possible to prepare an organic FET with a shorter channel than the mask vapor deposition method, whereby it becomes possible to take out a large current even in a case where a low mobility organic semiconductor material is used as an active layer. Further, the electrode patterning layer obtainable by the method of the present invention has an excellent electrical insulating property, whereby it can be used also as a gate insulating layer, and it becomes possible to further simplify the production process.

EXAMPLES

Now, the present invention will be described in further detail with reference to Examples and Comparative Examples, but it should be understood that the present invention is by no means restricted to the following Examples.

In the following Preparation Examples, the molecular weight of a polyamic acid or a polyimide was measured by a GPC apparatus (SSC-7200, manufactured by Senshu Scientific Co., Ltd.) provided with GPC columns (KD-803/KD-805, Shodex®).

Column temperature: 50° C.
Eluent: N,N-dimethylformamide (as additives, 30 mmol/L of lithium bromide monohydrate ($LiBr.H_2O$), 30 mmol/L of phosphoric anhydride crystal (o-phosphoric acid), and 10 ml/L of tetrahydrofuran (THF))
Flow rate: 1.0 ml/min
Standard samples for preparing calibration curves: TSK standard polyethylene oxides (molecular weights: about 900,000, 150,000, 100,000, 30,000) manufactured by TOSOH CORPORATION, and polyethylene glycols (molecular weights: about 12,000, 4,000, 1,000) manufactured by Polymer Laboratories Ltd.

Further, for the imidated ratio of a soluble to polyimide, the polyimide is dissolved in $d_6$-DMSO (dimethylsulfoxide-$d_6$), and $^1$H-NMR was measured, whereupon the ratio of amic groups remaining without being imidated was obtained from the integrated values of proton peaks, and the imidated ratio was calculated.

Irradiation with ultraviolet ray in Examples and Comparative Examples, was carried out by using an ultraviolet ray irradiation device (manufactured by Nikon Corporation) having a high pressure mercury lamp as the light source, via a filter for passing ultraviolet ray in the vicinity of a wavelength of 254 nm. Further, for the dose of ultraviolet ray, illuminance was measured each time by using an illuminance meter having a sensitivity at 254 nm (UV-M02, manufactured by ORC), and the dose was calculated by multiplying this illuminance by the irradiation time. Here, the illuminance at a wavelength of 254 nm by this ultraviolet illumination device was from 3.8 to 5.4 mW/cm$^2$.

The measurement of the contact angle to water was carried out by using a fully automatic contact angle meter CA-W (manufactured by Kyowa Interface Science Co., LTD.) in a constant temperature/high humidity environment (25° C.±2° C., 50% RH±5%) after leaving 3 μl of the liquid to stand still for 5 seconds after its deposition.

Preparation Example 1

Preparation of Polyamic Acid (PI-1)

In a nitrogen stream, into a 200 mL four-necked flask, 8.01 g (0.040 mol) of 4,4'-diaminodiphenyl ether (hereinafter referred to simply as DDE) was put and dissolved in 87.6 g of N-methyl-2-pyrolidone (hereinafter referred to simply as NMP) and then, 7.45 g (0.038 mol) of 1,2,3,4-cyclobutane tetracarboxylic dianhydride (hereinafter referred to simply as CBDA) was added. The mixture was stirred at 23° C. for 5 hours to carry out a polymerization reaction and further diluted with NMP to obtain a 6 wt % solution of a polyamic acid (PI-1). The number average molecular weight (Mn) and the weight average molecular weight (Mw) of the obtained polyamic acid (PI-1) were Mn=14,000 and Mw-32,600, respectively.

Preparation Example 2

Preparation of Polyamic Acid (PI-2)

In a nitrogen stream, into a 200 mL four-necked flask, 1.29 g (0.012 mol) of p-phenylenediamine and 10.66 g (0.028 mol) of 4-[4-(4-heptylcyclohexyl)phenoxy]-1,3-diaminobenzene were put and dissolved in 111.7 g of NMP, and then 7.77 g (0.040 mol) of CBDA was added. The mixture was stirred at 23° C. for 5 hours to carry out a polymerization reaction and further diluted with NMP to obtain a 4 wt % solution of a polyamic acid (PI-2). The number average molecular weight (Mn) and the weight average molecular weight (Mw) of the obtained polyamic acid (PI-2) were Mn=14,000 and Mw=29,000, respectively.

Preparation Example 3

Preparation of Polyamic Acid (PI-3)

In a nitrogen stream, into a 200 mL four-necked flask, 16.42 g (0.040 mol) of 2,2-bis[4-(4-aminophenoxy)phenyl] propane was put and dissolved in 135.3 g of NMP, and then 7.45 g (0.038 mol) of CBDA was added. The mixture was stirred at 23° C. for 5 hours to carry out a polymerization reaction and further diluted with NMP to obtain a 6 wt % solution of a polyamic acid (PI-3). The number average molecular weight (Mn) and the weight average molecular weight (Mw) of the obtained polyamic acid (PI-3) were Mn=16,000 and Mw=35,000, respectively.

Preparation Example 4

Preparation of Polyamic Acid (PI-4)

In a nitrogen stream, into a 200 mL four-necked flask, 20.74 g (0.040 mol) of 2,2-bis[4-(4-aminophenoxy)phenyl]

hexafluoropropane was put and dissolved in 159.8 g of NMP, and then 7.45 g (0.038 mol) of CBDA was added. The mixture was stirred at 23° C. for 5 hours to carry out a polymerization reaction and further diluted with NMP to obtain a 6 wt % solution of a polyamic acid (PI-4). The number average molecular weight (Mn) and the weight average molecular weight (Mw) of the obtained polyamic acid (PI-4) were Mn=15,000 and Mw=33,100, respectively.

Preparation Example 5

Preparation of Polyimide (PI-5)

In a nitrogen stream, into a 200 mL four-necked flask, 7.01 g (0.035 mol) of DDE was put and dissolved in 88.35 g of NMP, and then 8.58 g (0.034 mol) of bicyclo[3.3.0]-octane-2,4,6,8-tetracarboxylic dianhydride was added. The mixture was stirred at 80° C. for 3 hours to carry out a polymerization reaction. The obtained polyamic acid solution was diluted with NMP to 7 wt %. To 50 g of this solution, 3.0 g of acetic anhydride and 2.3 g of pyridine were added as imidation catalysts, followed by stirring at room temperature for 30 minutes and then the mixture was heated to 120° C. and further reacted for two hours to obtain a polyimide solution. This solution was put into a large amount of methanol, and the obtained white precipitate was collected by filtration and dried to obtain a white polyimide powder. This polyimide powder was confirmed to be 97% imidated by $^1$H-NMR. 4 g of this powder was dissolved in a mixed solvent of 49.24 g of NMP and 13.43 g of butyl cellosolve to obtain a 6 wt % solution of a polyimide (PI-5). The number average molecular weight (Mn) and the weight average molecular weight (Mw) of the obtained polyimide (PI-5) were Mn=14,500 and Mw=31,000, respectively.

Preparation Example 6

Preparation of Polyimide (PI-6)

In a nitrogen stream, into a 200 mL four-necked flask, 4.86 g (0.045 mol) of p-phenylenediamine and 1.74 g (0.005 mol) of 4-hexadecyloxy-1,3-diaminobenzene were put and dissolved in 122.5 g of NMP, and then 15.01 g (0.050 mol) of 3,4-dicarboxy-1,2,3,4-tetrahydro-1-naphthalene succinic acid dianhydride was added. The mixture was stirred at room temperature for 10 hours to carry out a polymerization reaction. The obtained polyamic acid solution was diluted with NMP to 8 wt %. To 50 g of this solution, 10.8 g of acetic anhydride and 5.0 g of pyridine were added as imidation catalysts, followed by a reaction at 50° C. for 3 hours to obtain a polyimide solution. This solution was put into a large amount of methanol, and the obtained white precipitate was collected by filtration and dried to obtain a white polyimide powder. This polyimide powder was confirmed to be 90% imidated by $^1$H-NMR. 4 g of this powder was dissolved in a mixed solvent of 52.67 g of γ-butyrolactone and 10 g of butyl cellosolve to obtain a 6 wt % solution of a polyimide (PI-6). The number average molecular weight (Mn) and the weight average molecular weight (Mw) of the obtained polyimide (PI-6) were Mn=18,000 and Mw=54,000, respectively.

Comparative Preparation Example 1

Preparation of Polyamic Acid (PI-7)

In a nitrogen stream, into a 200 mL four-necked flask, 8.01 g (0.040 mol) of DDE was put and dissolved in 91.9 g of NMP, and then 8.20 g (0.038 mol) of pyromellitic dianhydride was added. The mixture was stirred at 23° C. for two hours to carry out a polymerization reaction and further diluted with NMP to obtain a 6 wt % solution of a polyamic acid (PI-7). The number average molecular weight (Mn) and the weight average molecular weight (Mw) of the obtained polyamic acid (PI-7) were Mn=11,500 and Mw=25,200, respectively.

Example 1

On an ITO-coated glass substrate (2.5 cm×2.5 cm, thickness: 0.7 mm), the solution of PI-1 prepared in Preparation Example 1 was dropped by a syringe provided with a 0.2 μm-perforated filter and applied by a spin coating method. Then, it was heated on a hot plate of 80° C. for 5 minutes to evaporate the organic solvent and then baked on a hot plate of 230° C. for 15 minutes to obtain a polyimide film having a thickness of about 100 nm.

The contact angle to water of this polyimide film was measured and found to be 59°. The surface of a polyimide film obtained in the same manner was irradiated with ultraviolet ray under each condition of 10 J/cm$^2$, 20 J/cm$^2$, 30 J/cm$^2$ and 40 J/cm$^2$, and the respective contact angles to water were measured. As a result, it was confirmed that by irradiation with ultraviolet ray at 40 J/cm$^2$, the contact angle lowered to 10°, and a sufficient change (49°) in contact angle for patterning the electrode-forming solution, was shown. Further, the results of measurement of the contact angles to water at the respective doses of ultraviolet ray are shown in Table 1.

Example 2

Using the solution of PI-2 prepared in Preparation Example 2, a polyimide film was prepared in the same manner as in Example 1, and the relation between the dose of ultraviolet ray and the contact angle to water was examined. However, at the time of forming the polyimide film, baking after evaporation of the organic solvent was for 30 minutes at 210° C. As a result, the contact angle to water was 92° when not irradiated with ultraviolet ray and 22° when irradiated with ultraviolet ray at 40 J/cm$^2$, and it was confirmed that a sufficient change (70°) in contact angle for patterning the electrode-forming solution, was shown. Further, the results of measurement of the contact angles to water at the respective doses of ultraviolet ray are shown in Table 1 given hereinafter.

Example 3

Using the solution of PI-3 prepared in Preparation Example 3, a polyimide film was prepared in the same manner as in Example 1, and the relation between the dose of ultraviolet ray and the contact angle to water was examined. However, at the time of forming the polyimide film, baking after evaporation of the organic solvent was for 15 minutes at 230° C. As a result, the contact angle to water was 73° when not irradiated with ultraviolet ray and 9° when irradiated with ultraviolet ray at 40 J/cm$^2$, and it was confirmed that a sufficient change (64°) in contact angle for patterning the electrode-forming solution, was shown. Further, the results of measurement of the contact angles to water at the respective doses of ultraviolet ray are shown in Table 1 given hereinafter.

Example 4

Using the solution of PI-4 prepared in Preparation Example 4, a polyimide film was prepared in the same manner as in Example 1, and the relation between the dose of ultraviolet ray and the contact angle to water was examined. However, at the time of forming the polyimide film, baking after evaporation of the organic solvent was for 30 minutes at 250° C. As a result, the contact angle to water was 84° when not irradiated with ultraviolet ray and 19° when irradiated with ultraviolet ray at 40 J/cm², and it was confirmed that a sufficient change (65°) in contact angle for patterning the electrode-forming solution, was shown. Further, the results of measurement of the contact angles to water at the respective doses of ultraviolet ray are shown in Table 1 given hereinafter.

Example 5

Using the solution of PI-5 prepared in Preparation Example 5, a polyimide film was prepared in the same manner as in Example 1, and the relation between the dose of ultraviolet ray and the contact angle to water was examined. As a result, the contact angle to water was 63° when not irradiated with ultraviolet ray and 13° when irradiated with ultraviolet ray at 40 J/cm², and it was confirmed that a sufficient change (50°) in contact angle for patterning the electrode-forming solution, was shown. Further, the results of measurement of the contact angles to water at the respective doses of ultraviolet ray are shown in Table 1 given hereinafter.

Example 6

Using the solution of PI-6 prepared in Preparation Example 6, a polyimide film was prepared in the same manner as in Example 1, and the relation between the dose of ultraviolet ray and the contact angle to water was examined. As a result, the contact angle to water was 76° when not irradiated with ultraviolet ray and 13° when irradiated with ultraviolet ray at 40 J/cm², and it was confirmed that a sufficient change (63°) in contact angle for patterning the electrode-forming solution, was shown. Further, the results of measurement of the contact angles to water at the respective doses of ultraviolet ray are shown in Table 1 given hereinafter.

Comparative Example 1

Using the solution of PI-7 prepared in Comparative Preparation Example 1, a polyimide film was prepared in the same manner as in Example 1, and the relation between the dose of ultraviolet ray and the contact angle to water was examined. As a result, the contact angle to water was 69° when not irradiated with ultraviolet ray and 62° also when irradiated with ultraviolet ray at 40 J/cm², and thus, a sufficient change in contact angle for patterning the electrode-forming solution was not shown. Further, the results of measurement of the contact angles to water at the respective doses of ultraviolet ray are shown in Table 1 given hereinafter.

TABLE 1

Doses of Ultraviolet Ray and Contact Angles to Water

| | Not irradiated, | 10 J/cm² | 20 J/cm² | 30 J/cm² | 40 J/cm² |
|---|---|---|---|---|---|
| EX. 1 | 59°, | 60°, | 47°, | 23°, | 10° |
| EX. 2 | 92°, | 83°, | 67°, | 46°, | 22° |
| EX. 3 | 73°, | 58°, | 22°, | 11°, | 9° |
| EX. 4 | 84°, | 74°, | 45°, | 24°, | 19° |
| EX. 5 | 63°, | 56°, | 34°, | 23°, | 13° |
| EX. 6 | 76°, | 61°, | 46°, | 24°, | 13° |

TABLE 1-continued

Doses of Ultraviolet Ray and Contact Angles to Water

| | Not irradiated, | 10 J/cm² | 20 J/cm² | 30 J/cm² | 40 J/cm² |
|---|---|---|---|---|---|
| Comp. EX. 1 | 69°, | 67°, | 65°, | 63°, | 62° |

Example 7

In the same manner as in Examples 1 to 5, polyimide films were prepared from the solutions of PI-1 to PI-5. These polyimide films were irradiated with ultraviolet ray at 40 J/cm² in a pattern through a mask of a shape wherein windows of 1 cm×0.5 cm were disposed with a space of about 0.17 mm, to obtain electrode patterning layers.

On each such an electrode patterning layer, as an electrode-forming solution, a solution having Baytron P (model No. AI-4083, manufactured by Bayer Ltd.) diluted five times with pure water was dropped in an amount of from 20 μl to 40 μl only at the portion irradiated with ultraviolet ray. At that time, the electrode-forming solution readily wettingly spread at the portion irradiated with ultraviolet ray, but the solution was repelled at the portion not irradiated with ultraviolet ray, and no connection of the solution was observed at the space with a width of 0.17 mm. Then, using a hot plate of 80° C. in atmospheric air, drying was carried out for 60 minutes to obtain the patterned electrodes shown in FIGS. 1 to 4.

Comparative Example 2

Figure 1:
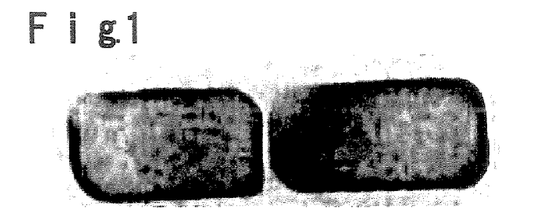
FIG. 1 shows a patterned electrode prepared by an electrode patterning layer obtained from a solution of PI-1 in Example 7.
Figure 2:
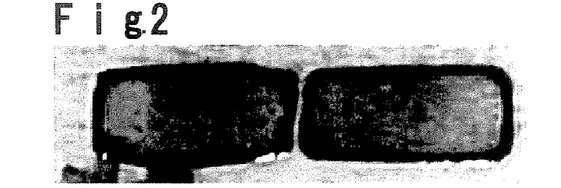
FIG. 2 shows a patterned electrode prepared by an electrode patterning layer obtained from a solution of PI-2 in Example 7.
Figure 3:
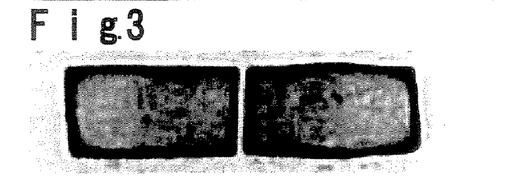
FIG. 3 shows a patterned electrode prepared by an electrode patterning layer obtained from a solution of PI-3 in Example 7.
Figure 4:
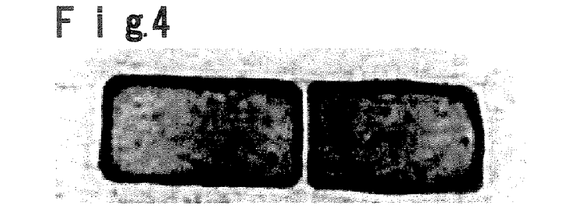
FIG. 4 shows a patterned electrode prepared by an electrode patterning layer obtained from a solution of PI-4 in Example 7.
Figure 5:
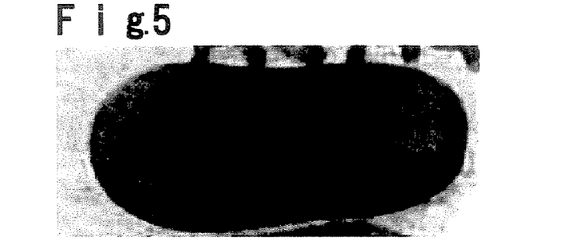
FIG. 5 shows an electrode shape in a case where a polyimide film obtained from a solution of PI-7 was used in Comparative Example 2.

In the same manner as in Comparative Example 1, a polyimide film was prepared from the solution of PI-7. This polyimide film was irradiated with ultraviolet ray in a pattern in the same manner as in Example 7. On this polyimide film, as an electrode-forming solution, a solution having Baytron P (model No. AI-4083, manufactured by Bayer Ltd.) diluted five times with pure water was dropped in an amount of from 20 μl to 40 μl only at the portion irradiated with ultraviolet ray. However, the electrode-forming solution did not wettingly spread and stayed as it was at the dropped position. Further, even when the amount of the solution increased, it did not form a pattern, and the solution was connected at the space with a width of 0.17 mm. Then, using a hot plate of 80° C. in atmospheric air, drying was carried out for 60 minutes, but as shown in FIG. 5, a patterned electrode was not obtained.

Example 8

Figure 6:
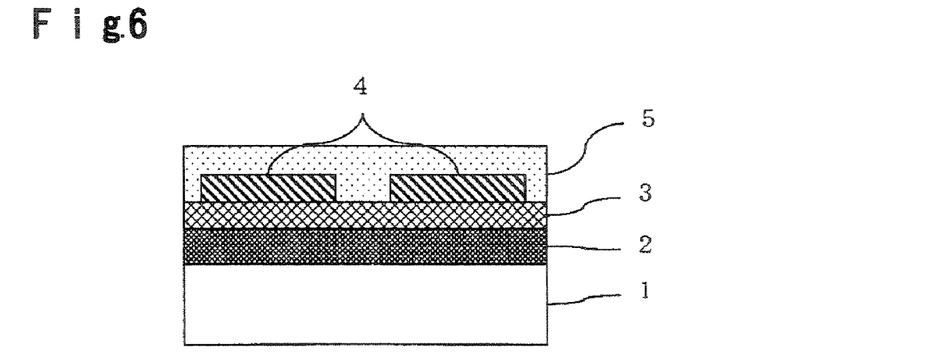
FIG. 6 is a sectional view of an organic FET prepared in Examples 8 to 10.

To ascertain the effects of the electrode patterning layer, an organic FET having a structure shown in FIG. 6 was prepared. The preparation procedure is shown below.

As a gate electrode 1 for the organic FET, a n-type highly-doped silicon substrate (4 inches, thickness: 0.5 mm) was used, and by thermally oxidizing this n-type highly-doped silicon substrate, a $SiO_2$ film having a thickness of 220 nm was formed, and this film was used as a gate insulating film 2. At that time, $SiO_2$ was formed also on the rear side of the n-type highly-doped silicon substrate, and $SiO_2$ on the rear side was removed by dipping it in a $SiO_2$ etchant ($HF:H_2O:NH_4F$=30 ml:180 ml:120 g) for 15 minutes. At that time, to protect $SiO_2$ on the front surface of the n-type highly-doped silicon substrate from the etchant, OFPR-800 (manufactured by Tokyo Ohka Kogyo Co., Ltd.) was applied by a spin coating method and heated by a hot plate of 85° C. to evaporate the solvent to form a surface protecting film. This n-type highly-doped silicon substrate was cut into a square of 2.5 cm×2.5 cm, and then the protecting film was removed by a releasing agent and cleaned with pure water.

The solution of PI-3 prepared in Preparation Example 3 was dropped on the gate insulating film 2 by a syringe provided with a 0.2 μm-perforated filter and applied by a spin coating method. Thereafter, in atmospheric air, it was heated on a hot plate of 80° C. for 5 minutes to evaporate the organic solvent and then baked on a hot plate of 230° C. for 60 minutes to obtain a polyimide film having a thickness of 150 nm.

This polyimide film was irradiated with ultraviolet ray at 40 J/cm² in a pattern through a photomask of a shape wherein two openings of 2 mm×5 mm were disposed with a space of 50 μm to obtain an electrode patterning layer 3.

On this electrode patterning layer 3, as an electrode-forming solution, a solution having Baytron PHC V4 (manufactured by H.C. Starck) diluted 1.43 times with ethanol, was dropped in an amount of from 0.5 to 1.0 μl only on the portion irradiated with ultraviolet ray. At that time, the electrode-forming solution readily wettingly spreaded at the portion irradiated with ultraviolet ray, but at the portion not irradiated with ultraviolet ray, the solution was repelled. Thereafter, it was left in atmospheric air at room temperature until the solvent was dried up and then heated in a vacuum oven at 120° C. for 30 minutes to completely dry up the remaining solvent thereby to prepare electrodes. The electrodes are used as the source/drain electrodes 4 for an organic FET.

On the electrode patterning layer 3 provided with the source/drain electrodes 4, 50 nm of pentacene (manufactured by Kurogane Kasei Co., Ltd.) was vapor-deposited at a rate of 2 nm/min at room temperature under a condition of at most $10^{-3}$ Pa by using a vacuum vapor deposition device (manufactured by AOYAMA ENGINEERING CORPORATION), and it was designated as an organic semiconductor layer 5. Then, unnecessary pentacene other than on the electrodes and channel portions was scraped off not to damage the $SiO_2$ film thereby to obtain an organic FET.

The prepared organic FET was left to stand for a sufficiently long time in vacuum of at most $10^{-1}$ Pa in order to remove influences of impurities such as moisture and oxygen in the pentacene film, and then its electrical characteristics were measured while the vacuum state was maintained by means of HP4156C (manufactured by Agilent).

For the characteristics of drain current $I_D$ and drain voltage $V_{DG}$ (hereinafter referred to as the $I_D$-$V_{DS}$ characteristics) of the organic FET, the source electrode was earthed and a gate voltage $V_G$ of –40 V was applied to the gate electrode, and in that state, the drain voltage $V_{DS}$ of from 0 V to –40 V was applied stepwisely every –2 V to the drain electrode, whereby the drain current $I_D$ flowing between the source/drain electrodes was measured, and in the same manner, the drain current $I_D$ was measured when the gate voltage $V_G$ was changed to –30 V, –20 V, –10 V and 0 V. Further, with respect to a graph wherein the square root of the absolute value of the drain current $I_D$ was plotted on the ordinate, and the gate voltage $V_G$ was plotted on the abscissa, a tangent line was drawn at the portion where the inclination of the graph became substantially constant, and from the inclination of the tangent line, the mobility of pentacene was calculated. At that time, with respect to the square root of the absolute value of the drain current $I_D$, the values when the gate voltage $V_G$ of from +20 V to –40 V was applied stepwisely every –1 V while the drain voltage $V_{DS}$ was set to be constant at –40 V, were plotted.

Figure 7:
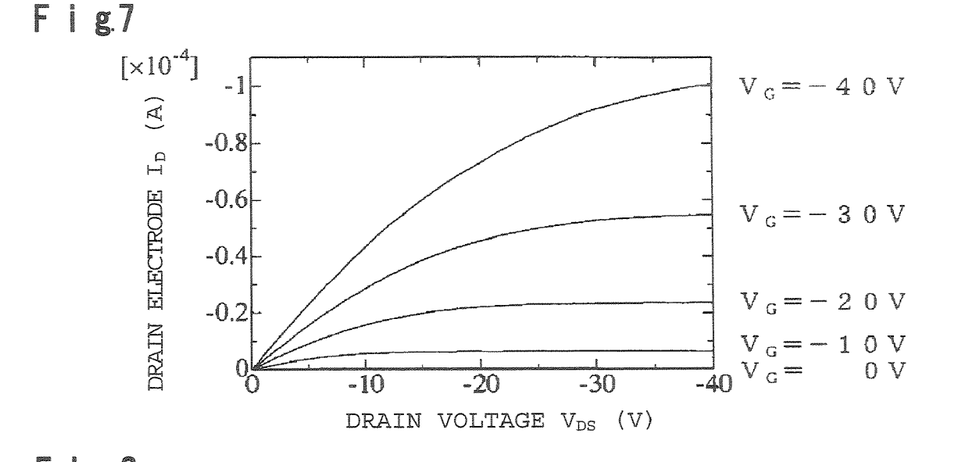
FIG. 7 shows the $I_D$-$V_{DS}$ characteristics of an organic FET having a channel length of 50 μm formed by an electrode patterning layer obtained from a solution of PI-3 in Example 8.

The channel length of the organic FET was measured by an optical microscope and found to be about 50 μm. Further, the shape of the electrodes was also the same as the pattern of the photomask. The $I_D$-$V_{DS}$ characteristics of this organic FET were measured, and the characteristics as shown in FIG. 7 were obtained, whereby it was confirmed to be normally operated as an organic FET. Further, on such a basis that the channel length was 50 μm, the channel width was 5 mm, and the capacitance of the laminated film of the $SiO_2$ and the electrode patterning layer was $8.3\times10^{-9}$ F/cm², the pentacene mobility was calculated and found to be 0.14 cm²/Vs.

Example 9

Figure 8:
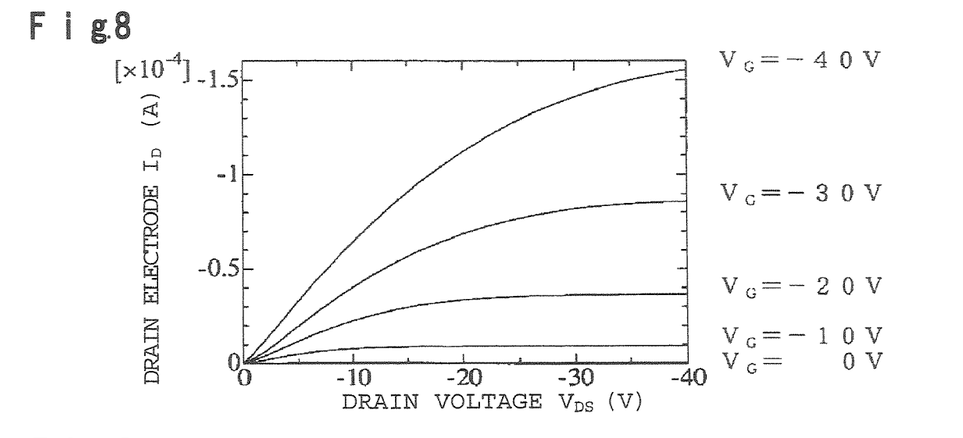
FIG. 8 shows the $I_D$-$V_{DS}$ characteristics of an organic FET having a channel length of 25 μm formed by an electrode patterning layer obtained from a solution of PI-3 in Example 9.

An organic FET was prepared in the same manner as in Example 8 except that the width between the openings of the photomask was changed to 25 μm. The channel length of the organic FET was measured by an optical microscope and found to be about 25 μm. The $I_D$-$V_{DS}$ characteristics of this organic FET were measured, and the characteristics shown in FIG. 8 were obtained, whereby it was found to be normally operated as an organic FET. Further, the mobility of pentacene was calculated in the same manner as in Example 8 except that the channel length was changed to 25 μm, and found to be 0.11 cm²/Vs.

Example 10

Figure 9:
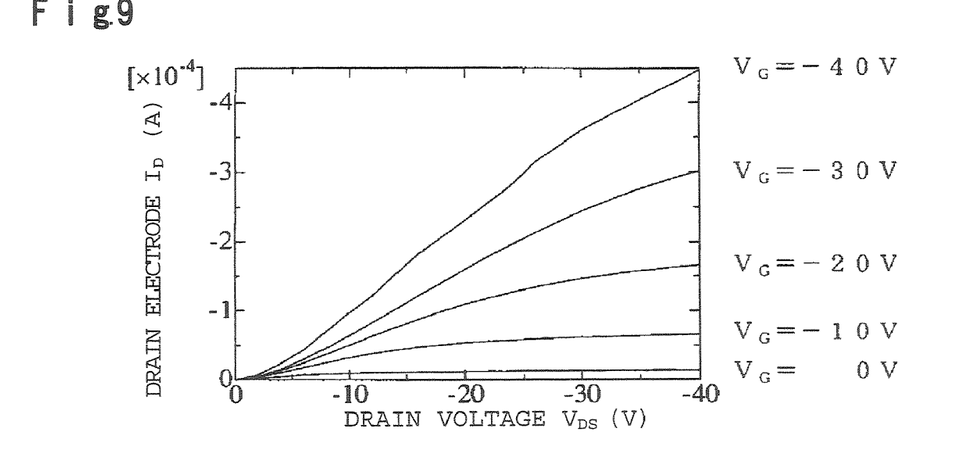
FIG. 9 shows the $I_D$-$V_{DS}$ characteristics of an organic FET having a channel length of 5 μm formed by an electrode patterning layer obtained from a solution of PI-3 in Example 10.

An organic FET was prepared in the same manner as in Example 8 except that the width between the openings of the photomask was changed to 5 μm. The channel length of the organic FET was measured by an optical microscope and found to be about 5 μm. The $I_D$-$V_{DS}$ characteristics of this organic FET were measured, and the characteristics shown in FIG. 9 were obtained, whereby it was found to be normally operated as an organic FET. Further, the mobility of pentacene was calculated in the same manner as in Example 8 except that the channel length was changed to 5 μm and the drain voltage $V_{DS}$ was changed to –80 V and found to be 0.09 cm²/Vs.

Thus, it was confirmed that the polyamic acid disclosed in the present invention or the polyimide obtainable by cyclic dehydration of such a polyamic acid, will function as an electrode patterning layer.

Preparation Example 7

Preparation of Polyamic Acid (PI-8)

In a nitrogen stream, into a 200 mL four-necked flask, 7.41 g (0.037 mol) of DDE was put and dissolved in 84.06 g of NMP, and then 0.726 g (0.0037 mol) of CBDA and 6.70 g (0.0307 mol) of pyromellitic dianhydride were added. The mixture was stirred at 23° C. for 5 hours to carry out a polymerization reaction and further diluted with NMP to obtain a 6 wt % solution of a polyamic acid (PI-8). The number average molecular weight (Mn) and the weight average molecular weight (Mw) of the obtained polyamic acid (PI-8) were Mn=13,192 and Mw=31,854, respectively.

Preparation Example 8

Preparation of Polyamic Acid (PI-9)

In a nitrogen stream, into a 200 mL four-necked flask, 3.60 g (0.018 mol) of DDE was put and dissolved in 40.70 g of NMP, and then 0.657 g (0.00335 mol) of CBDA and 2.92 g (0.0134 mol) of pyromellitic dianhydride were added. The mixture was stirred at 23° C. for 5 hours to carry out a polymerization reaction and further diluted with NMP to obtain a 6 wt % solution of a polyamic acid (PI-8). The number average molecular weight (Mn) and the weight average molecular weight (Mw) of the obtained polyamic acid (PI-8) were Mn=13,363 and Mw=35,809, respectively.

Preparation Example 9

Preparation of Polyamic Acid (PI-10)

In a nitrogen stream, into a 200 mL four-necked flask, 3.60 g (0.018 mol) of DDE was put and dissolved in 40.07 g of NMP, and then 1.64 g (0.00837 mol) of CBDA and 1.83 g (0.00837 mol) of pyromellitic dianhydride were added. The mixture was stirred at 23° C. for 5 hours to carry out a polymerization reaction and further diluted with NMP to obtain a 6 wt % solution of a polyamic acid (PI-9). The number average molecular weight (Mn) and the weight average molecular weight (Mw) of the obtained polyamic acid (PI-9) were Mn=13,037 and Mw=32,243, respectively.

Example 11

On an ITO-coated glass substrate (2.5 cm×2.5 cm, thickness: 0.7 mm), the solution of PI-8 prepared in Preparation Example 7 was dropped by a syringe provided with a 0.2 μm-perforated filter and applied by a spin coating method. Then, in atmospheric air, it was heated on a hot plate of 80° C. for 5 minutes to evaporate the organic solvent and then baked on a hot plate of 230° C. for 60 minutes to obtain a polyimide film having a thickness of about 200 nm.

The contact angle to water of this polyimide film was measured and found to be 69°. The surface of a polyimide film obtained in the same manner was irradiated with ultraviolet ray under each condition of 20 J/cm² and 40 J/cm², and the respective contact angles to water were measured. As a result, it was confirmed that by irradiation with ultraviolet ray at 40 J/cm², the contact angle lowered to 51°, and a sufficient change (18°) in contact angle for patterning the electrode-forming solution, was shown. Further, the results of measurement of the contact angles to water at the respective doses of ultraviolet ray are shown in Table 2 given hereinafter.

Example 12

Using the solution of PI-9 prepared in Preparation Example 8, a polyimide film was prepared in the same manner as in Example 11, and the relation between the dose of ultraviolet ray and the contact angle to water was examined. As a result, the contact angle to water was 68° when not irradiated with ultraviolet ray and 39° when irradiated with ultraviolet ray at 40 J/cm², and it was confirmed that a sufficient change (29°) in contact angle for patterning the electrode-forming solution, was shown. Further, the results of measurement of the contact angles to water at the respective doses of ultraviolet ray are shown in Table 2 given hereinafter.

Example 13

Using the solution of PI-10 prepared in Preparation Example 9, a polyimide film was prepared in the same manner as in Example 11, and the relation between the dose of ultraviolet ray and the contact angle to water was examined. As a result, the contact angle to water was 66° when not irradiated with ultraviolet ray and 20° when irradiated with ultraviolet ray at 40 J/cm², and it was confirmed that a sufficient change (46°) in contact angle for patterning the electrode-forming solution, was shown. Further, the results of measurement of the contact angles to water at the respective doses of to ultraviolet ray are shown in Table 2 given hereinafter.

TABLE 2

| | Doses of Ultraviolet Ray and Contact Angles to Water | | |
|---|---|---|---|
| | Not irradiated, | 20 J/cm², | 40 J/cm² |
| Ex. 11 | 69°, | 61°, | 51° |
| Ex. 12 | 68°, | 59°, | 39° |
| Ex. 13 | 66°, | 49°, | 20° |

INDUSTRIAL APPLICABILITY

The electrode patterning layer of the present invention is useful for forming patterned electrodes for various electronic devices.

The entire disclosures of Japanese Patent Application No. 2005-179210 filed on Jun. 20, 2005 and Japanese Patent Application No. 2005-258620 filed on Sep. 7, 2005 including specifications, claims, drawings and summaries are incorporated herein by reference in their entireties.

The invention claimed is:

1. An electrode patterning layer for forming an electrode pattern prepared by irradiating a layer comprising a polyamic acid having repeating units represented by the following formula (1) or a polyimide obtained by cyclodehydration of the polyamic acid, with ultraviolet ray in a pattern shape:

wherein A is a tetravalent organic group, B is a bivalent organic group, each of A and B can be a combination of different groups, and n is a positive integer, provided that at least one group of A is a tetravalent organic group having an alicyclic structure, wherein from 10 to 100 mol % of B in the formula (1) is at least one member selected from the structures represented by the following formulae (6) and (7):

-continued wherein each X independently is a single bond, an ether bond, an ester bond, a thioether bond, an amide bond, a $C_{1-5}$ alkylene group which may have a branched structure, or a $C_{1-5}$ alkylenedioxo group which may have a branched structure, $R^5$ is an alkyl group having at most 2 carbon atoms, $R^6$ is a monovalent organic group having a long chain alkyl group or a fluorinated long chain alkyl group, having at least 6 carbon atoms, and j is 0 or 1.

2. The electrode patterning layer according to claim 1, wherein the alicyclic structure is at least one member selected from the structures represented by the following formulae (2) to (5):

in the formula (2), each of $R^1$, $R^2$, $R^3$ and $R^4$ which are independent of one another, is hydrogen, fluorine, or a $C_{1-4}$ organic group.

3. The electrode patterning layer according to claim 1, wherein at least 20 mol % of A in the formula (1) is a tetravalent organic group having an alicyclic group.

4. The electrode patterning layer according to claim 1, wherein at least 20 mol % of B in the formula (1) is a bivalent organic group having a fluorine atom, or a bivalent organic group having an alkyl group or a fluorinated alkyl group in a side chain.

5. The electrode patterning layer according to claim 1, wherein the contact angle to water or an electrode-forming solution is at least 50° at a portion not irradiated with ultraviolet ray and at most 30° at a portion irradiated with ultraviolet ray.

6. The electrode patterning layer according to claim 5, prepared by irradiation with ultraviolet ray at a dose of at most 40 J/cm².

7. The electrode patterning layer according to claim 1, wherein at least one $R^5$ is a methyl group.

8. A method for producing an electrode patterning layer, comprising irradiating a layer comprising a polyamic acid having repeating units represented by the formula (1) of claim 1 or a polyimide obtained by cyclodehydration of the polyamic acid, with ultraviolet ray in a pattern shape.

9. A patterned electrode prepared by coating the electrode patterning layer according to claim 1 with an electrode-forming solution.

10. An electronic device comprising the patterned electrode according to claim 9.

11. An organic field-effect transistor (FET) comprising the patterned electrode according to claim 9.

12. A process for producing a patterned electrode, by irradiating a layer comprising a polyamic acid having repeating units represented by the following formula (1) or a polyimide obtained by cyclodehydration of the polyamic acid, with ultraviolet ray in a pattern shape and then coating with an electrode-forming solution:

wherein A is a tetravalent organic group, B is a bivalent organic group, each of A and B can be a combination of different groups, and n is a positive integer, provided that at least one type of A is a tetravalent organic group having an alicyclic structure,
wherein from 10 to 100 mol % of B in the formula (1) is at least one member selected from the structures represented by the following formulae (6) and (7):

wherein each X independently is a single bond, an ether bond, an ester bond, a thioether bond, an amide bond, a $C_{1-5}$ alkylene group which may have a branched structure, or a $C_{1-5}$ alkylenedioxo group which may have a branched structure, $R^5$ is an alkyl group having at most 2 carbon atoms, $R^6$ is a monovalent organic group having a long, chain alkyl group or a fluorinated long chain alkyl group, having at least 6 carbon atoms, and j is 0 or 1.

13. The process for producing a patterned electrode according to claim 12, wherein at least one $R^5$ is a methyl group.

14. An electrode patterning layer for forming an electrode pattern prepared by irradiating a layer comprising a polyamic acid having repeating units represented by the following formula (1) or a polyimide obtained by cyclodehydration of the polyamic acid, with ultraviolet ray in a pattern shape:

(1)

wherein A is a tetravalent organic group, B is a bivalent organic group, each of A and B can be a combination of different groups, and n is a positive integer, provided that at least one group of A is a tetravalent organic group having an alicyclic structure, wherein the alicyclic structure is at least one member selected from the structures represented by the following formulae (2) to (5):

(2)

(3)

(4)

(5)

wherein in the formula (2), each of $R^1$, $R^2$, $R^3$ and $R^4$ independent of one another is hydrogen, fluorine, or a $C_{1-4}$ organic group, and $R^1$, $R^2$, $R^3$ and $R^4$ are not simultaneously hydrogen.

15. An electrode patterning layer for forming an electrode pattern prepared by irradiating a layer comprising a polyamic acid having repeating units represented by the following formula (1) or a polyimide obtained by cyclodehydration of the polyamic acid, with ultraviolet ray in a pattern shape:

(1)

wherein A is a tetravalent organic group, B is a bivalent organic group, each of A and B can be a combination of different groups, and n is a positive integer, provided that at least one group of A is a tetravalent organic group having an alicyclic structure, wherein from 10 to 100 mol % of B in the formula (1) is the structures represented by the following formula (7):

(7)

wherein X is a single bond, an ether bond, an ester bond, a thioether bond, an amide bond, a $C_{1-5}$ alkylene group which may have a branched structure, or a $C_{1-5}$ alkylenedioxo group which may have a branched structure, $R^6$ is a monovalent organic group having a long chain alkyl group or a fluorinated long chain alkyl group, having at least 6 carbon atoms, and j is 0 or 1.

16. An electrode patterning layer for forming an electrode pattern prepared by irradiating a layer comprising a polyamic acid having repeating units represented by the following formula (1) or a polyimide obtained by cyclodehydration of the polyamic acid, with ultraviolet ray in a pattern shape:

(1)

wherein A is a tetravalent organic group, B is a bivalent organic group, each of A and B can be a combination of different groups, and n is a positive integer, provided that at least one group of A is a tetravalent organic group having an alicyclic structure, wherein from 10 to 100 mol % of B in the formula (1) is the structures represented by the following formula (6):

(6)

wherein
when j is 1, X is a single bond, an ester bond, a thioether bond, an amide bond, a $C_{2-5}$ alkylene group which may have a branched structure, or a $C_{1-5}$ alkylene-dioxo group which may have a branched structure, and each of $R^5$ independently of one another is an alkyl group having at most 4 carbon atoms, or a perfluoroalkyl group, and when j is 0, each of $R^5$ independently of one another is an alkyl group having at most 2 carbon atoms.

17. The electrode patterning layer according to claim 16, wherein at least one $R^5$ is a methyl group.

18. A process for producing a patterned electrode, by irradiating a layer comprising a polyamic acid having repeating units represented by the following formula (1) or a polyimide obtained by cyclodehydration of the polyamic acid, with ultraviolet ray in a pattern shape and then coating with an electrode-forming solution:

(1)

wherein A is a tetravalent organic group, B is a bivalent organic group, each of A and B can be a combination of different groups, and n is a positive integer, provided that at least one type of A is a tetravalent organic group having an alicyclic structure, wherein the alicyclic structure is at least one member selected from the structures represented by the following formulae (2) to (5):

(2)

(3)

(4)

(5)

wherein in the formula (2), each of $R^1$, $R^2$, $R^3$ and $R^4$ independent of one another is hydrogen, fluorine, or a $C_{1-4}$ organic group, and $R^1$, $R^2$, $R^3$ and $R^4$ are not simultaneously hydrogen.

19. A process for producing a patterned electrode, by irradiating a layer comprising a polyamic acid having repeating units represented by the following formula (1) or a polyimide obtained by cyclodehydration of the polyamic acid, with ultraviolet ray in a pattern shape and then coating with an electrode-forming solution:

(1)

wherein A is a tetravalent organic group, B is a bivalent organic group, each of A and B can be a combination of different groups, and n is a positive integer, provided that at least one type of A is a tetravalent organic group having an alicyclic structure, wherein from 10 to 100 mol % of B in the formula (1) is the structures represented by the following formula (7):

(7)

wherein X is a single bond, an ether bond, an ester bond, a thioether bond, an amide bond, a $C_{1-5}$ alkylene group which may have a branched structure, or a $C_{1-5}$ alkylene-dioxo group which may have a branched structure, $R^6$ is a monovalent organic group having a long chain alkyl group or a fluorinated long chain alkyl group, having at least 6 carbon atoms, and j is 0 or 1.

20. A process for producing a patterned electrode, by irradiating a layer comprising a polyamic acid having repeating units represented by the following formula (1) or a polyimide obtained by cyclodehydration of the polyamic acid, with ultraviolet ray in a pattern shape and then coating with an electrode-forming solution:

(1)

wherein A is a tetravalent organic group, B is a bivalent organic group, each of A and B can be a combination of different groups, and n is a positive integer, provided that at least one type of A is a tetravalent organic group having an alicyclic structure,
wherein from 10 to 100 mol % of B in the formula (1) is the structures represented by the following formula (6):

(6)

wherein
when j is 1, X is a single bond, an ester bond, a thioether bond, an amide bond, a $C_{2-5}$ alkylene group which may have a branched structure, or a $C_{1-5}$ alkylenedioxo group which may have a branched structure, and each of $R^5$ independently of one another is an alkyl group having at most 4 carbon atoms, or a perfluoroalkyl group, and
when j is 0, each of $R^5$ independently of one another is an alkyl group having at most 2 carbon atoms.

21. The process for producing a patterned electrode according to claim 20, wherein at least one $R^5$ is a methyl group.

* * * * *